(12) United States Patent
Lee

(10) Patent No.: US 6,277,678 B1
(45) Date of Patent: Aug. 21, 2001

(54) METHODS OF MANUFACTURING THIN FILM TRANSISTORS USING INSULATORS CONTAINING WATER

(75) Inventor: Joo-hyung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 08/835,588

(22) Filed: Apr. 9, 1997

(51) Int. Cl.[7] .................... H01L 21/00; H01L 21/31; H01L 21/469
(52) U.S. Cl. ............... 438/151; 438/152; 438/783; 438/786; 438/162
(58) Field of Search ............... 438/783, 209, 438/158, 786, 151, 162, 149

(56) References Cited

U.S. PATENT DOCUMENTS

| | | | |
|---|---|---|---|
| 4,433,008 | * | 2/1984 | Schnable et al. .......... 427/85 |
| 4,628,405 | * | 12/1986 | Lippert .................... 361/321 |
| 4,789,564 | * | 12/1988 | Kanner et al. ............ 427/255.6 |
| 4,868,619 | * | 9/1989 | Mukherjee et al. ........ 357/23.5 |
| 5,213,986 | * | 5/1993 | Pinker et al. ............ 437/20 |
| 5,304,398 | * | 4/1994 | Kruasell et al. .......... 427/255.3 |
| 5,376,590 | * | 12/1994 | Machida et al. ........... 437/235 |
| 5,401,316 | * | 3/1995 | Shiraishi et al. ......... 118/689 |
| 5,501,870 | * | 3/1996 | Shiraishi et al. ......... 427/8 |
| 5,504,359 | * | 4/1996 | Rodder ................... 257/329 |
| 5,512,513 | * | 4/1996 | Machida et al. ........... 437/195 |
| 5,721,601 | * | 2/1998 | Yamaji et al. ............ 349/138 |
| 5,731,216 | * | 3/1998 | Holmberg et al. ......... 437/40 |

FOREIGN PATENT DOCUMENTS 10-229196 * 8/1998 (JP) .

OTHER PUBLICATIONS

"High . . . Processing", IEEE transactions on Electron Devices vol. 42.,No. 2. pp 251–257, Kohno A. et al., May 1995.*
"The Impact . . . TFT'S", IEEE Electron Device Letters, vol. 15, No. 1,pp 1–3, Sasaki M. et al., Jan. 1994.*
Sano et al., "High Quality $SiO_2$/Si Interfaces of Poly–Crystalline Silicon Thin Film Transistors by Annealing in Wet Atmosphere", IEEE Electron Devices, vol. 16, No. 5, May 1995, pp. 157–160.

* cited by examiner

Primary Examiner—Olik Chaudhuri
Assistant Examiner—Shrinivas H. Rao
(74) Attorney, Agent, or Firm—Myers Bigel Sibley & Sajovec

(57) ABSTRACT

A thin film transistor including a gate, a source, and a drain is formed on a substrate. An insulating film containing $H_2O$ is formed on the thin film transistor. For example, spin-on glass (SOG) containing $H_2O$ may be used. $H_2O$ contained in the insulating film is diffused through the thin film transistor by performing thermal processing on the insulating film. Trapping centers in the polysilicon may therefore be reduced.

23 Claims, 5 Drawing Sheets

METHODS OF MANUFACTURING THIN FILM TRANSISTORS USING INSULATORS CONTAINING WATER

FIELD OF THE INVENTION

The present invention relates to methods for manufacturing liquid crystal displays, and more particularly to methods for manufacturing thin film transistor-liquid crystal displays in which thin film transistors (hereinafter, TFT) are used as active elements.

BACKGROUND OF THE INVENTION

Liquid crystal displays (hereinafter, LCD) are flat panel display devices utilizing liquid crystal technology and semiconductor technology. LCD technology is based on the optical characteristics of the liquid crystal whose molecular arrangement is changed by an electric field.

A thin film transistor-LCD (hereinafter TFT-LCD) can consume low power, use low driving voltage, and be thin and light. The TFTs may be divided into polysilicon TFTs and amorphous silicon TFTs, based upon the material of the semiconductor layer used as a channel.

Processes for manufacturing the polysilicon TFT-LCD may be divided into low temperature processing (for example performed at a temperature of not more than 400° C.) and high temperature processing (for example performed at a temperature of more than 900° C.). In particular, low temperature processing performed at a temperature of not more than 350° may be most appropriate for manufacturing an LCD having a large area since the processing can be performed on a glass substrate. This may make the polysilicon TFT-LCD more competitive than the amorphous silicon TFT-LCD.

However, trapping centers which may hinder the movement of electrons or holes may exist in both the low temperature processing and the high temperature processing due to grain boundaries in the polysilicon. The trapping centers may lower the mobility of the carriers and may increase the threshold voltage of the TFT.

Various techniques are generally used in order to manufacture a high performance TFT using low temperature processing.

First, a technique for forming a polysilicon film of good quality on a substrate without thermal transformation of the substrate is often used. Rapid crystallization by laser induction can be used to form a polysilicon film of good quality. Since crystallization of the silicon thin film using a laser can be performed without heating the substrate at a high temperature, the substrate may be damaged less. Thus, the mobility of the carriers in polysilicon which is formed by laser anneal may be larger than about 100 $cm^2/Vs$.

Second, a technique for forming a surface of good quality between the polysilicon film and an oxide film at a low temperature is used. When the trap density is high on the surface between the polysilicon film and the oxide film, the threshold voltage of the TFT may become higher. Although a plasma enhanced CVD (hereinafter, PECVD) may be appropriate for forming the oxide film at a low temperature, for example, 200° C. to 400° C., the PECVD may severely deteriorate the surface between the polysilicon film and the oxide film. There are various methods for reducing the deterioration of the surface, such as electron cyclotron resonance plasma CVD (ECR CVD) and radio frequency (RF) parallel-plate remote plasma CVD. In RF parallel-plate remote plasma CVD, it is possible to form a uniform thin film over a wide area. The polysilicon TFT having an oxide film formed by the remote plasma CVD may have a high mobility of about 400 $cm^2/Vs$ and a low threshold voltage of about 1.5V.

Third, an annealing technique after metallization is often used. The characteristic of the TFT may be improved when the TFT is annealed at a temperature of 270° C. in air. However, such an annealing method may impact the reproduction of the oxide film and the surface between the oxide film and the silicon film. In such an annealing method, it may be difficult to control humidity of air. Therefore, an annealing in which vapor is controlled at a low temperature is generally provided. The vapor may be most effective for annealing the TFT having an oxide film formed by the remote plasma CVD in the air at a low temperature.

The above-mentioned basic technologies are described in a publication entitled *"High Quality $SiO_2/Si$ Interfaces of Poly-Crystalline Silicon Thin Film Transistors by Annealing in Wet Atmosphere"*, Vol. 16, No. 5, May 1995, pp. 157–160 by Naoki Sano, et al.

In the above-mentioned conventional technology, the substrate may be annealed in a vapor atmosphere in order to remove trapping centers on the surface between the polysilicon film and the oxide film during the manufacture of the TFT. The oxide film is generally not formed by a general CVD method, but generally may be forced by the remote plasma CVD method in order to more effectively remove the trapping centers.

SUMMARY OF THE INVENTION

It is therefore an object of the present invention to provide improved thin film transistors and liquid crystal displays using thin film transistors.

It is another object of the present invention to provide thin film transistors and liquid crystal displays which include reduced numbers of trapping centers in the polysilicon films thereof.

These and other objects are provided, according to the present invention, by forming an insulating film containing water ($H_2O$) on a thin film transistor and diffusing the water contained in the insulating film into the polysilicon film of the thin film transistor. Diffused water can thereby reduce trapping sites in the polysilicon film. An insulating film of spin-on glass (SOG), containing water is preferably used.

In particular, thin film transistors are manufactured according to the present invention by forming a thin film transistor comprising a gate, a source and a drain on a substrate. An insulating film containing $H_2O$ is formed on the thin film transistor. $H_2O$ contained in the insulating film is diffused into the thin film transistor.

The diffusing step preferably comprises the step of thermally processing the insulating film containing $H_2O$ to diffuse $H_2O$ contained therein into the thin film transistor. After the diffusing step, the insulating film containing $H_2O$ may be planarized.

The insulating film containing $H_2O$ preferably comprises a spin-on glass (SOG) film having a thickness of between 1000 Å and 3000 Å. The diffusing step is preferably performed at temperatures between 300° C. and 40° C.

After the insulating film containing $H_2O$ is formed, another insulating film may be formed, selected from the group consisting of nitride or oxide nitride films. Moreover, a second thermal processing step may be used to rearrange the hydrogen in the water diffused into the thin film transistor and to also relax the stress in the insulating film containing H$_2$O. The second thermal processing step may be performed at temperatures between 150° C. and 200° C. A contact hole may be formed in the insulating films to expose the drain, and a pixel electrode be formed connected to the drain electrode through the contact hole.

The thin film transistor itself may be formed by depositing an amorphous film on a substrate and crystallizing the amorphous film. A semiconductor film pattern is then formed by patterning the semiconductor film. A gate insulating film and the gate electrode are formed on the semiconductor film pattern and a source and a drain are formed by doping the semiconductor film pattern. An interlayer dielectric film including contact holes for exposing the source and the drain is formed on the semiconductor film pattern, and a source electrode and a drain electrode is connected to the source and drain through the contact holes. The amorphous silicon may be crystallized using a laser, and the source and drain may be formed by ion showered doping the semiconductor film pattern. The steps of forming an insulating film containing H$_2$O on the thin film transistor and then diffusing the H$_2$O in the insulating film containing H$_2$O into the thin film transistor may be repeatedly performed.

According to the present invention, an insulating film containing much H$_2$O such as SOG is used. Therefore, it is possible to lower the threshold voltage of the transistor by reducing the traps formed on the surface between the polysilicon film and the oxide film by diffusing the H$_2$O contained in the SOG into the element. Reduced leakage currents and increased mobility may be obtained. SOG is widely used as an insulating film for microelectronics, and bake processing is generally not an additional processing step. As a result, the performance of a semiconductor device may be improved and manufacturing costs may be lowered. The present invention may also be used to manufacture polysilicon layers having low defects.

DETAILED DESCRIPTION OF PREFERRED EMBODIMENTS

Figure 1:
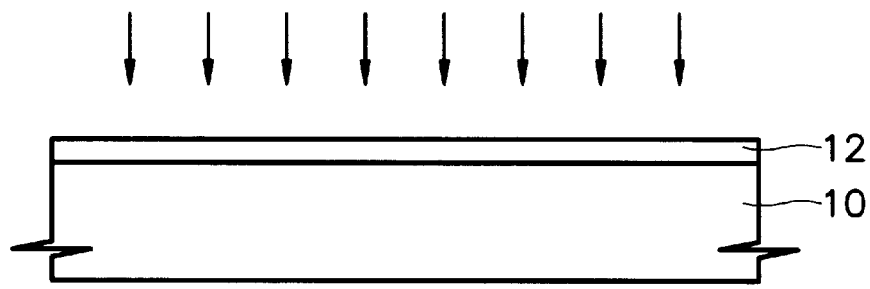
FIGS. 1 to 8 describe steps of methods for forming a thin film transistor-liquid crystal display according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

In the present invention, a passivation layer is formed using an insulating film containing much H$_2$O using low temperature polysilicon processing, for example at a temperature of not more than 350° C., and which is appropriate for large area LCDs. Therefore, trap at the surface may be cured by diffusing the H$_2$O contained in the insulating film, into a polysilicon thin film transistor.

Much H$_2$O and H$_2$ with various organic materials are contained in a spin-on glass (SOG) film, which is one type of insulating film containing H$_2$O. Also, the SOG film is a liquid insulating material and can fill a very narrow space as can polyamide. Other CVD thin films may form a void. However, the SOG film is unlikely to form a void.

The SOG film has many other advantages. Namely, excellent step coverage can be obtained even though there are square portions in the underlying patterns. The step coverage may become better as the space becomes narrower. The processing for forming SOG is simple, defect density in the SOG is generally low, and the productivity of SOG is generally high. Also, processing costs of SOG are generally not expensive and SOG can be safely manufactured without dealing with dangerous gases. The SOG film is a silicate mixed in a solvent based on alcohol, and becomes similar to an oxide film (SiO$_2$) since the solvent generally is volatilized during bake processing and only solid materials remain after the bake processing.

Methods for manufacturing TFT-LCDs in which SOG is used will be described in detail with reference to the attached drawings. However, the present invention is not restricted to these methods.

FIGS. 1 to 8 are cross-sectional views illustrating steps for manufacturing thin film transistor-liquid crystal displays according to the present invention. The method is applied to a top gate type TFT.

Referring to FIG. 1, a semiconductor film 12, to be used as the channel of the TFT, is formed by crystallizing an amorphous silicon film after depositing the amorphous silicon to a thickness of 300 Å to 1500 Å on a transparent substrate 10 such as glass. The crystallization may be performed using a laser crystallizing method.

Figure 2:
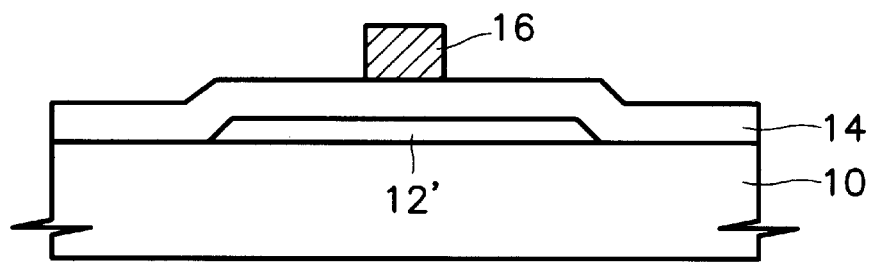

Referring to FIG. 2, after forming a semiconductor film pattern 12' by patterning the semiconductor film, a gate insulating film 14 is formed by depositing an oxide film of a thickness of 500 Å to 2500 Å or a nitride film of a thickness of 1000 Å to 5000 Å. Then, a gate electrode 16 is formed on the gate insulating film 14 by depositing aluminum or aluminum alloy of a thickness of 2000 Å to 4000 Å and patterning it.

Figure 3:
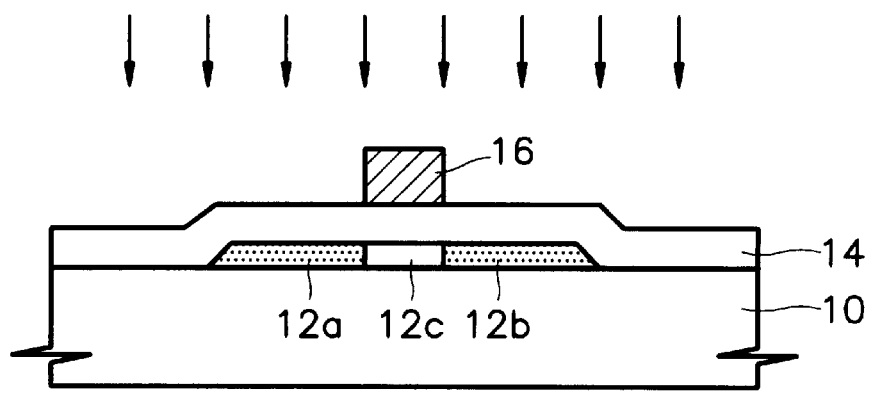

Referring to FIG. 3, a source region 12a and a drain region 12b are formed by implanting impurity ions into the semiconductor film pattern. The ion implanting may be performed by an ion shower doping method using the gate electrode 16 as a mask. Boron (B) or phosphorus (P) can be used as the implanted impurities according to the type of the TFT to be formed. The portion which is masked by the gate electrode 16 and into which the impurity ions are not implanted, becomes the channel 12c of the TFT.

Figure 4:
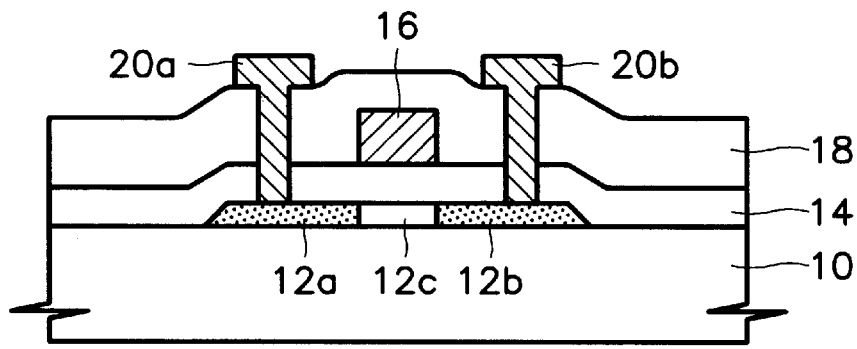

Referring to FIG. 4, an interlayer dielectric film 18 is formed on the source region 12a and the drain region 12b by depositing an oxide film or a nitride film. Contact holes for exposing the source region 12a and the drain region 12b are formed by partially etching the interlayer dielectric film 18 using photolithography. Then, a source electrode 20a and a drain electrode 20b are formed by depositing a conductive material such as aluminum to a thickness of 4000 Å to 8000 Å and patterning it.

Figure 5:
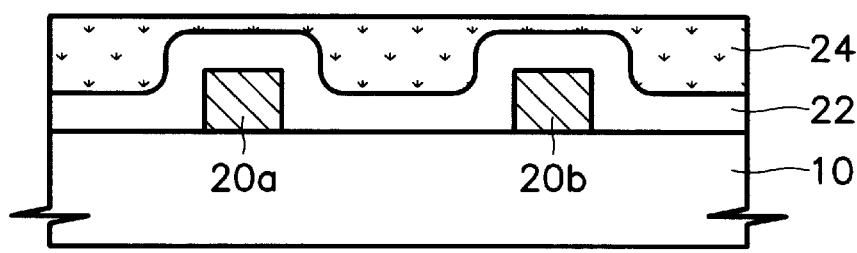

Referring to FIG. 5, a first insulating film 22 is formed on the entire surface of the resultant structure in which the source electrode 20a and the drain electrode 20b are formed, by depositing an insulating film. The first insulating film 22 can be formed by a CVD method. The first insulating film 22 can be formed of a silicon oxide film deposited by a plasma enhanced chemical vapor deposition (PECVD) method or an atmosphere pressure CVD (APCVD) method, or a silicon nitride film deposited by the PECVD method. Also, the first insulating film 22 can be formed to have a thickness of 1000 Å to 10,000 Å and is preferably formed to be as thin as possible so that $H_2O$ is easily diffused from a film to be formed on the first insulating film 22 as described below. For example, the silicon oxide film is preferably formed to have a thickness of 4000 Å to 5000 Å.

Figure 6:
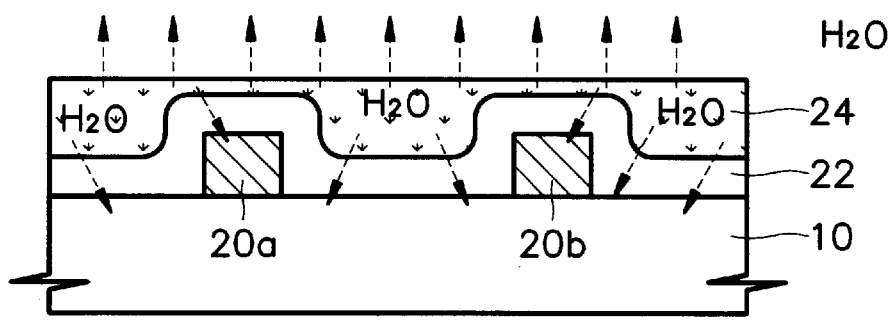
Figure 7:
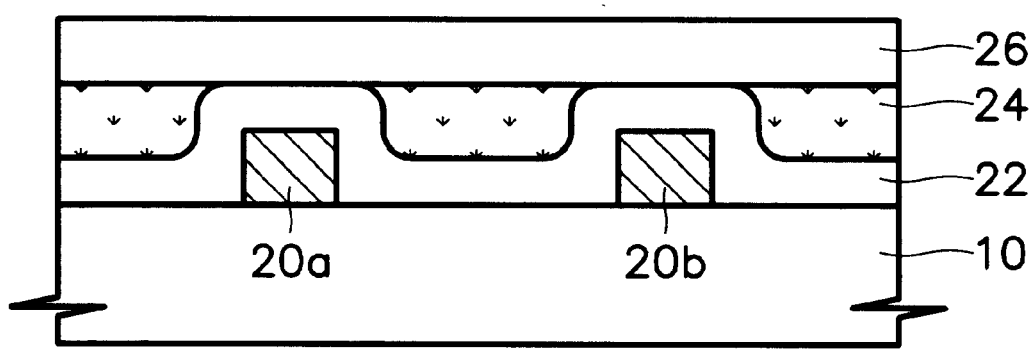

In the above-mentioned FIG. 5 and FIGS. 6 and 7 to be described hereafter, the structure of the lower portion of the first insulating film 22 is schematically shown in order to explain processing for forming first to third insulating films more easily.

Then, a second insulating film 24 is formed on the first insulating film 22 as a passivation layer. The second insulating film 24 is formed of an insulating film containing much $H_2O$ and is preferably formed of an SOG film which contains much $H_2O$ and $H_2$, and which is easily planarized.

The SOG film which is liquid can be coated to have uniform thickness on the first insulating film 22 by the same method as photoresist such as a spin coating method. Also, the SOG film can fill the space between the patterns such as the gate electrode 16, the source electrode 20a and the drain electrode 20b which may cause step differences, without defects such as voids, since the SOG film can obtain an excellent degree of flatness in a narrow space.

The solvent included in the SOG film is very rapidly volatilized after the SOG film is coated. Therefore, SOG spray and spin cycles should be designed in order to obtain appropriate thickness uniformity.

The second insulating film 24, i.e., the SOG film is formed to have a thickness of 1000 Å to 3500 Å. However, the thickness of the SOG film should be determined considering the fact that much solvent is volatilized during the following bake processing, and $H_2O$ is diffused to the outside, thus applying tension on the SOG.

Referring to FIG. 6, the second insulating film 24, i.e., the spin coated SOG film is baked at a temperature of 300° C. to 400° C. for 0.5 to 4 hours.

The processing for baking the SOG film 24 will now be described in detail. When the SOG film 24 is baked, the solvent is volatilized from the SOG film 24. Simultaneously, $H_2O$ is diffused from the SOG film 24. In the drawing, arrows show that $H_2O$ is diffused outside the SOG film during the baking processing. $H_2O$ is diffused into the first insulating film 22 formed n the lower portion of the SOG film 24 and the inside of the element. $H_2O$ is diffused from the SOG film 24 to the outside because of the polymerization of silanol groups (SiOH) in the SOG film 24 caused by baking the SOG film.

$H_2O$ reduces the trap density on the surface between the silicon film and the oxide film by curing traps formed on the surface. This fact was published in an article entitled "High Quality $SiO_2$/Si Interfaces of Poly-Crystalline Silicon Thin Film Transistors by Annealing in Wet Atmosphere", Vol. 16, No. 5, May 1995, pp. 157–160 by Naoki Sano, et al. The trap density formed on the surface between the silicon film and the oxide film may be lowered and the threshold voltage of the transistor may be lowered due to the diffusion of $H_2O$. Also, data processing may be performed more rapidly since leakage currents on the surface between the silicon film and the oxide film are reduced and the mobility of the carrier is increased.

In order to obtain excellent thickness uniformity of the SOG film used as the second insulating film 24, a single coating step may not be sufficient. Therefore, the processing for coating and baking the SOG film may be performed many times. In particular, it is preferable to repeat the steps of coating and baking the SOG film two or three times in an order of, for example, coating the SOG/baking the resultant structure/coating the SOG/baking the resultant structure. When the thickness uniformity and stability against stress of the SOG film are excellent, the processing for forming the SOG film may be completed by a coating and baking process and the next processing steps can proceed.

Referring to FIG. 7, the surface of the second insulating film 24 which underwent the baking processing is planarized. The planarizing processing is performed by etching back the second insulating film 24 until the surface of the first insulating film 22 is exposed. The planarizing is performed by filling the second insulating film in the space between the patterns such as the gate electrode, the source electrode 20a and the drain electrode 20b, which cause the step difference by this processing.

A third insulating film 26 is formed by depositing a nitride film or the composite film of a nitride film and an oxide film on the entire surfaces of the second insulating film 24 and the first insulating film 22 which underwent the planarizing processing. The thickness of the third insulating film 26 may be determined by the parasitic capacitance between the source electrode 20a, the drain electrode 20b and a pixel electrode to be later formed on the third insulating film 26, and is generally 3000 Å to 5000 Å. The first to third insulating films operate as the passivation layer for protecting the TFT. In particular, the third insulating film 26 suppresses the movement of $H_2O$ between the outside and the element in the following processing.

Figure 8:
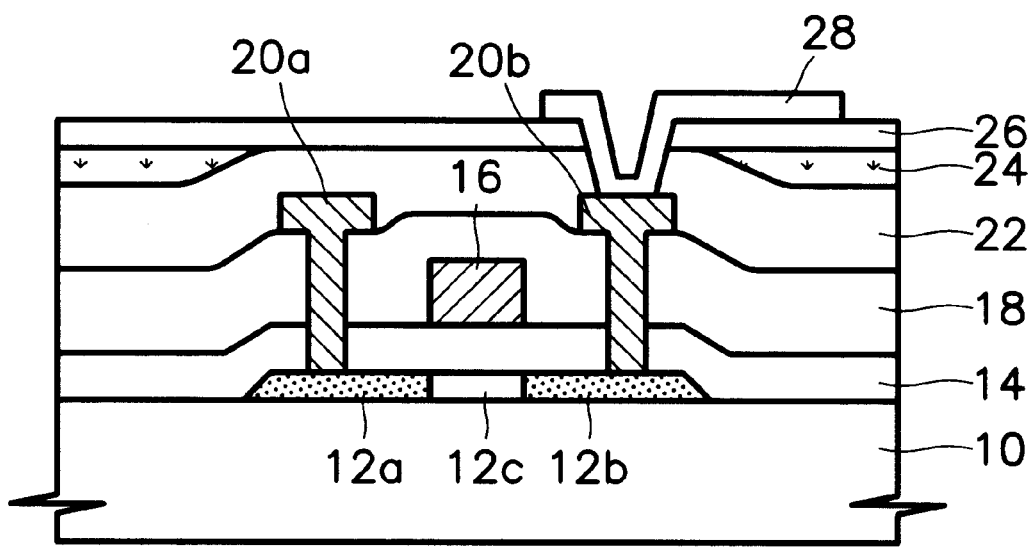

Referring to FIG. 8, a contact hole for partially exposing the drain electrode 20b is formed by anisotropically etching the first to third insulating films using photolithography. Then, a transparent conductive film such as indium tin oxide (ITO) is formed to a thickness of 350 Å to 1500 Å on the resultant structure in which the contact hole is formed. A pixel electrode 28 connected to the drain electrode 20b is formed by patterning the ITO film.

Then, the resultant structure in which the pixel electrode 28 is formed is annealed at a low temperature of 150° C. to 250° C. $H_2$ received during the processing of baking the SOG film may be rearranged inside the film. Stable Si—H and Si—OH bonding may be obtained, and stress formed in the SOG film during the processing for baking the SOG film may be relaxed by the annealing processing. The second thermal processing may be performed prior to forming the third insulating film 26.

According to the present invention, two thermal processing steps are performed. A first thermal processing is used for baking the SOG film. A second thermal processing comprises annealing before or after forming the pixel electrode is also performed. The mobility of the TFT may be increased and the threshold voltage may be reduced compared with a conventional method in which a general CVD oxide film is used as the passivation layer.

Figure 9:
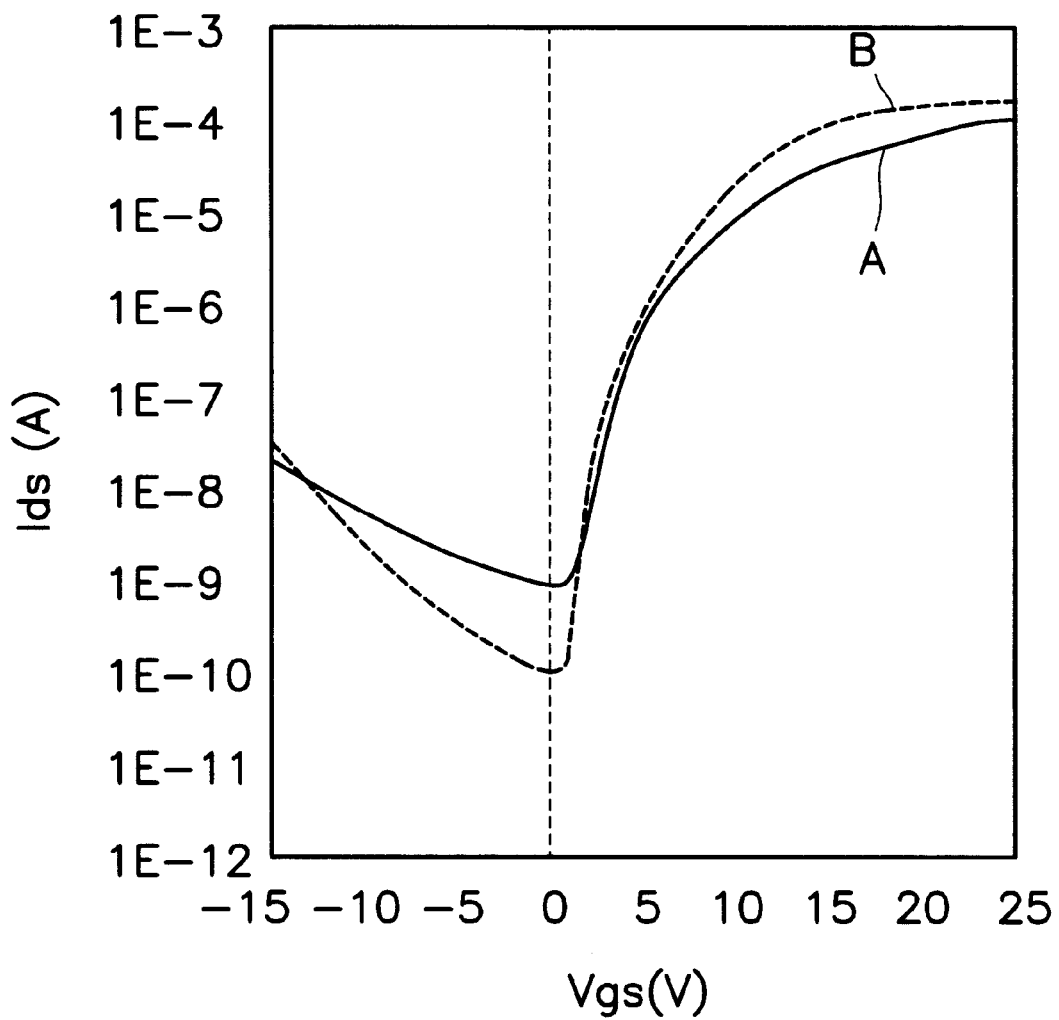
FIGS. 9 and 10 are graphs showing the gate voltage of the thin film transistor currents Vgs flowing between a source and a drain Ids.
Figure 10:
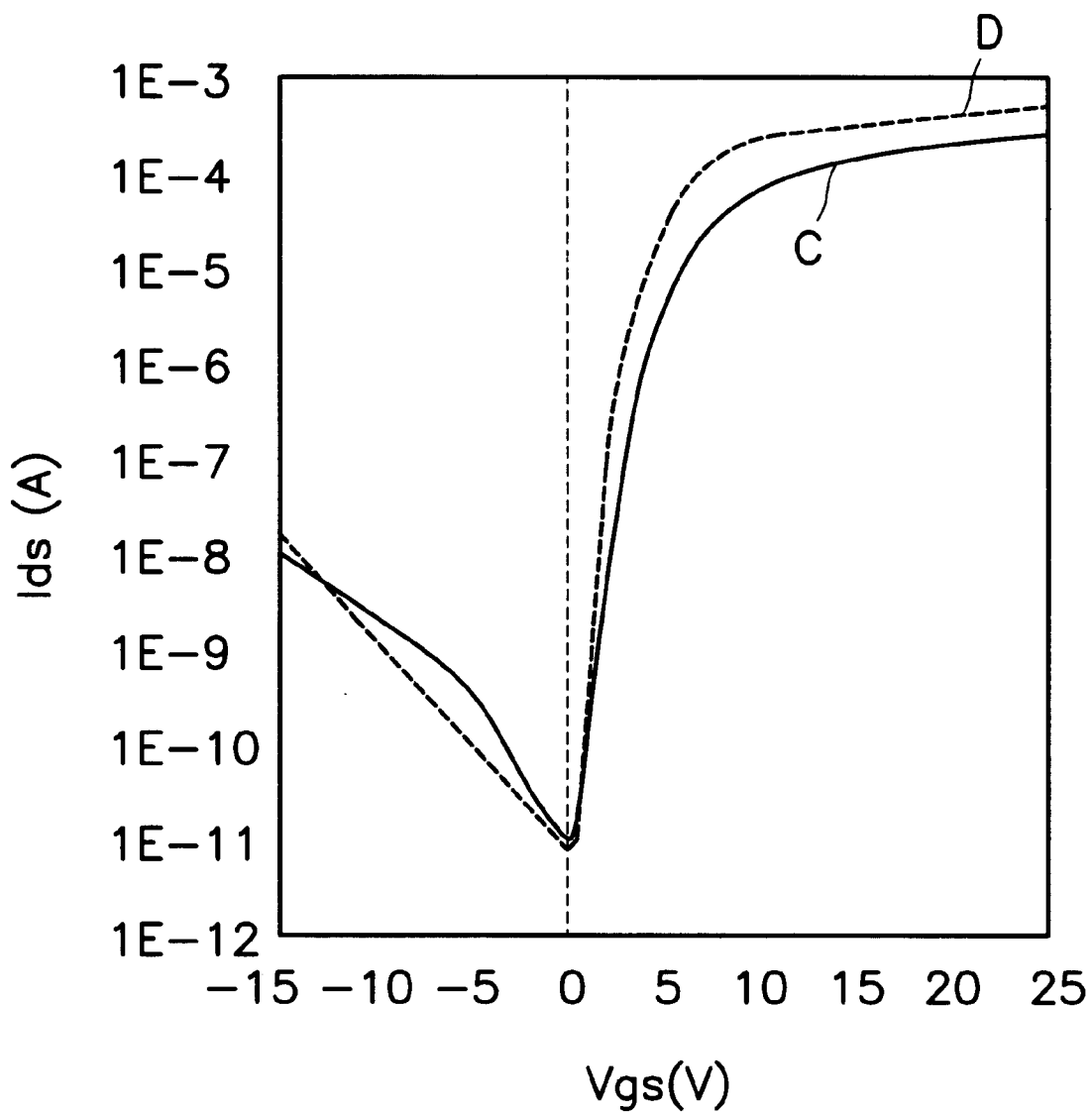

Such a result is illustrated in FIGS. 9 and 10. FIGS. 9 and 10 are graphs showing source/drain currents with respect to the gate voltage when using a PECVD oxide film and the SOG film as the passivation layer.

In FIGS. 9 and 10, the horizontal axis shows a voltage Vgs applied to the gate electrode and the vertical axis shows currents Ids flowing between the source and the drain of the TFT. The voltage Vds between the drain and the source is 10V. Reference numeral A shows the case in which the PECVD oxide film is used as the passivation layer. Reference numerals B and C show a case in which the coating and the first thermal processing are performed with respect to the SOG film. Reference numeral D shows a case in which the coating, the first thermal processing the second thermal processing are performed with respect to the SOG film.

More current flows between the source and the drain under the same gate voltage in the case (B) in which the SOG film is used as the passivation layer than in the case (A) in which the PECVD oxide film is used as the passivation layer. More current flows between the source and the drain under the same gate voltage in the case (D) in which two thermal processing are performed after forming the SOG film than in the case (C) in which one thermal processing is performed. As a result, far less leakage currents are generated when the SOG film is used as the passivation layer and an appropriate thermal processing is performed according to the present invention, compared to when a general CVD oxide film is used.

According to methods for manufacturing thin film transistor-liquid crystal displays according to the present invention, the characteristics of the TFT may be improved by using an insulating film containing much $H_2O$ and $H_2$, such as SOG film, as the passivation layer. Such an effect is preferably achieved by two thermal processings at high and low temperatures. Namely, $H_2O$ and $H_2$ contained in the insulating film flow into the channel portion of the TFT and reduce the traps inside the grain boundaries, and the traps at the surface between the polysilicon film and the gate insulating film used as the channel, during the first processing for thermal treatment. The $H_2O$ is rearranged and stabilized and relaxes the stress of the insulating film generated during the first thermal processing during the second thermal processing before or after forming the pixel electrode. As a result, in the present invention, leakage currents may be reduced by lowering the threshold voltage of the TFT and by increasing the mobility of the carrier compared with a conventional method in which the trap density formed on the surface is reduced by permeating $H_2O$ into the surface between the silicon film and the oxide film using vapor of certain temperature and pressure.

Also, the SOG film may provide excellent flatness on the resultant structure containing a narrow space. Therefore, when the SOG film is used as the passivation layer, processing can be improved since the traps formed on the surface between the silicon film and the oxide film are reduced and the passivation layer is formed and flattened at the same time. Finally, when the SOG film is used, it is possible to increase the productivity of semiconductor manufacturing, since additional equipment for forming vapor are not necessary.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of manufacturing a thin film transistor, comprising the steps of:

forming a thin film transistor comprising a gate, a source and a drain on a substrate:

applying an insulating material containing $H_2O$ to the thin film transistor to form an insulating film containing $H_2O$ on the thin film transistor; and diffusing $H_2O$ from the insulating film containing $H_2O$ into the thin film transistor using at least one thermal processing step so as to reduce trap density at a surface between the substrate and the insulating film and decrease a threshold voltage associated with the thin film transistor and increase the mobility of carriers in the thin film transistor.

2. A method according to claim 1, wherein the diffusing step comprises the step of thermally processing the insulating film contains $H_2O$ to diffuse $H_2O$ contained therein into the thin film transistor.

3. A method according to claim 1 wherein the diffusing step is followed by the step of planarizing the insulating film.

4. The method of claim 1, wherein the insulating film containing $H_2O$ comprises a spin-on glass (SOG) film.

5. The method of claim 1, wherein the insulating film containing $H_2O$ is formed to have a thickness of 1000 Å to 3000 Å.

6. The method of claim 1, wherein the diffusing step is performed at a temperature of 300° C. to 400° C.

7. The method of claim 1, wherein the step of applying an insulating material is followed by the step of forming an insulating film selected from the group consisting of a nitride film and a composite film of an oxide film and a nitride film, on the insulating film containing $H_2O$.

8. A method for manufacturing a thin film transistor, comprising the steps of:

forming a thin film transistor comprising a gate, a source and a drain on a substrate;

applying an insulating material containing $H_2O$ to the thin film transistor to form an insulating film containing $H_2O$ on the thin film transistor, wherein the step of applying an insulating material is followed by the step of forming an insulating film selected from the group consisting of a nitride film and a composite film of an oxide film and a nitride film, on the insulating film containing $H_2O$; and diffusing $H_2O$ from the insulating film containing $H_2O$ into the thin film transistor using at least one thermal processing step so as to reduce trap density at a surface between the substrate and the insulating film and decrease a threshold voltage associated with the thin film transistor and increase the mobility of carriers in the thin film transistor, and wherein the diffusing step is followed by the step of rearranging $H_2$ in $H_2O$ diffused into the thin film transistor and relaxing the stress of the insulating film containing $H_2O$.

9. The method of claim 8, wherein the rearranging and relaxing step comprises the step of further thermally processing the thin film transistor.

10. The method of claim 8, wherein the further thermal processing is performed at a temperature of 150° C. to 200° C.

11. A method for manufacturing a thin film transistor-liquid crystal display, comprising the steps of:

forming a thin film transistor comprising a gate electrode, a source electrode and a drain electrode on a substrate;

applying an insulating material containing $H_2O$ to the thin film transistor to form an insulating film containing $H_2O$ on the thin film transistor;

diffusing $H_2O$ from the insulating film containing $H_2O$ into the thin film transistor;

planarizing the insulating film containing $H_2O$;

forming another insulating film on the planarized insulating film containing $H_2O$;

forming a contact hole in the insulating films to expose the drain; and forming a pixel electrode connected to the drain electrode through the contact hole.

12. A method according to claim 11, wherein the diffusing step comprises the step of thermally processing the insulating film containing $H_2O$ to diffuse $H_2O$ contained therein into the thin film transistor.

13. The method of claim 11, wherein the step of forming a thin film transistor comprises the steps of:

forming a semiconductor film by depositing an amorphous film on a substrate and crystallizing the amorphous film;

forming a semiconductor film pattern by patterning the semiconductor film;

forming a gate insulating film and a gate electrode on the semiconductor film pattern;

forming a source and a drain by doping the semiconductor film pattern;

forming an interlayer dielectric film including contact holes for exposing the source and the drain on the semiconductor film pattern; and forming a source electrode and a drain electrode respectively connected to the source and the drain through the contact holes.

14. The method of claim 13, wherein the amorphous silicon film is crystallized using a laser.

15. The method of claim 13, wherein the step of forming a source and drain is performed by ion shower doping the semiconductor film pattern.

16. The method of claim 11, wherein the insulating layer containing $H_2O$ comprises a spin-on glass (SOG) film.

17. The method of claim 11, wherein the diffusing step is performed at a temperature of 300° C. to 400° C.

18. The method of claim 11, wherein the other insulating film is selected from the group consisting of a nitride film and a composite film of an oxide film and a nitride.

19. The method of claim 11, wherein the coating and diffusing steps are repeatedly performed prior to the planarizing step.

20. The method of claim 11, wherein the diffusing step is followed by the step of rearranging $H_2$ in $H_2O$ diffused into the thin film transistor and relaxing the stress of the insulating film containing $H_2O$ by further thermally processing the thin film transistor.

21. A method for manufacturing a polysilicon layer in a thin film transistor comprising the steps of:

applying an insulating material containing $H_2O$ to a polysilicon layer to form an insulating film containing $H_2O$ on the polysilicon layer; and diffusing $H_2O$ from the insulating film containing $H_2O$ into the polysilicon layer using at least one thermal processing step so as to reduce trap density at a surface between the substrate and the insulating film and decrease a threshold voltage associated with the thin film transistor and increase the mobility of carriers in the thin film transistor.

22. The method of claim 21, wherein the diffusing step comprises the step of thermally processing the insulating film containing $H_2O$ to diffuse $H_2O$ contained therein into the polysilicon layer.

23. The method of claim 21, the insulating film containing $H_2O$ comprises a spin-on glass (SOG) film.

* * * * *

UNITED STATES PATENT AND TRADEMARK OFFICE
CERTIFICATE OF CORRECTION

PATENT NO. : 6,277,678 B1 Page 1 of 1
DATED : August 21, 2001
INVENTOR(S) : Joo-hyung Lee It is certified that error appears in the above-identified patent and that said Letters Patent is hereby corrected as shown below:

<u>Title page,</u>
Item [30], please add the following priority information as follows:

-- Foreign Application Priority Data
Sept. 4, 1996   (KR)   96-10607
April 3, 1997   (KR)   97-12306 --

Signed and Sealed this

Sixth Day of August, 2002

Attest:

JAMES E. ROGAN
Attesting Officer     Director of the United States Patent and Trademark Office